United States Patent

[11] 3,596,486

[72] Inventor Werner Dolder
Greenville, Tenn.
[21] Appl. No. 793,381
[22] Filed Jan. 23, 1969
[45] Patented Aug. 3, 1971
[73] Assignee Magnavox Company

[54] APPARATUS AND PROCESS FOR PRODUCING ELECTRICAL COMPONENTS
12 Claims, 8 Drawing Figs.

[52] U.S. Cl. .......... 72/129, 72/DIG. 10, 29/33 M, 72/330
[51] Int. Cl. .......... B21f 11/00, H01r, B21d 31/02
[50] Field of Search .......... 72/DIG. 10, 129, 330, 418, 325; 29/203 B

[56] References Cited

UNITED STATES PATENTS 2,222,220 11/1940 Binch .......... 72/330
2,854,054 9/1958 Gross .......... 72/DIG. 10
3,010,492 11/1961 Ryder .......... 72/DIG. 10

*Primary Examiner*—Charles W. Lanham
*Assistant Examiner*—R. M. Rogers
*Attorney*—Richard T. Seeger

ABSTRACT: The process and apparatus for electrical components in which the electrical components are spaced regularly apart and are held by tapes which secure the ends of the leads of the components and carry them into position for processing so that the components are continuously fed by positive means to a continuously rotatable member which receives the components, trims the edges thereof and forms them to a prescribed shape, the process described being a continuous inflow of components for processing and a continuous outflow of finished components with the result that the speed of production of the finished electrical components is greatly increased.

INVENTOR
WERNER DOLDER
by JEFFERS & YOUNG
Attorneys

PATENTED AUG 3 1971 3,596,486

INVENTOR
WERNER DOLDER
by JEFFERS & YOUNG
Attorneys

INVENTOR
WERNER DOLDER
by JEFFERS & YOUNG
Attorneys

APPARATUS AND PROCESS FOR PRODUCING ELECTRICAL COMPONENTS

BACKGROUND OF THE INVENTION

The present state of the art in the electrical industry has created an unprecedented demand for miniaturized electrical resistors, diodes, capacitors, and other components which are intended to form a part of printed circuit boards. Typically, such resistor elements and other such similar electrical components are required in vast numbers for the television industry, and radio industry, just to mention two of the many applications which require printed circuit boards, and hence electrical components, in large numbers. The problem has essentially become one of how to form electrical components at a rate sufficient to meet the need, such as such resistors, capacitors and the like being formed to a prescribed shape wherein they can be fitted into a printed circuit board. The small size of these components together with vast number needed have created special difficulties in handling, this being the "bottleneck" to speed of production necessary to satisfy the demand for these components. While the art has steadily improved from original concepts as to how to produce these components in substantial numbers, the rate is still not fast enough, nor reliable enough to meet the demands. Probably the best advance so far with respect to speed and reliability of operation is the method and apparatus for manufacturing electrical components which is disclosed in copending application, Ser. No. 733,568, filed May 31, 1968, and entitled "Machine For Treating Chemical Components" by George C. Susong, who assigned the application to the same assignee as the present application.

While the referenced application represents a substantial step forward from the machines preexisting the Susong application, it is limited to a so-called gravity-type feed, which limits the rate of input of electrical components into the machine for cutting and shaping of the components, and this limitation can be significant because the small mass of the components imposes a time limitation to feed under gravity into the machine and this limitation determines the limit of production of the components.

OBJECTS OF THE INVENTION

It is a principal object of the present invention to provide a new and improved process and apparatus for producing electrical components such as resistors, diodes, capacitors, and the like, intended for use in printed circuit boards, which is adapted for high-speed operation wherein substantially increased numbers of components can be treated to satisfy the demands of the industry for these components.

It is a further object of the present invention to provide an apparatus and process of producing cut and formed components such as resistors, diodes, capacitors and the like for printed circuit boards, which is especially adapted for cutting and forming the leads of the components in a high-speed, reliable manner without in any way damaging the components in the process of such cutting and forming operations.

A still further object of the present invention is to provide a new and improved apparatus and process for cutting and forming electrical components, in which the electrical components are at all times under positive driving force, and are translated to the apparatus and then through the apparatus to a final ejection whereby the apparatus and process is not limited to any gravity feed or gravity operation at any time, hence eliminating that prior bottleneck of production.

An overall object of the present invention is to provide a means in the form of process and apparatus for cutting and forming electrical components which is adaptable to automatic procedures for quickly and efficiently producing large numbers of components whatever spacing and lead length is required, and which can automatically shut itself off after obtaining a certain number of components. The components are at all times positively impelled, guided, and held during cutting and forming operations, so that even though fragile, the components are not damaged, but are at all times correctly aligned and reliably held.

Further objects and features of the present invention will be apparent from a consideration of the following description, which proceeds with reference to the accompanying drawings.

DETAILED DESCRIPTION OF THE INVENTION

Figure 1:
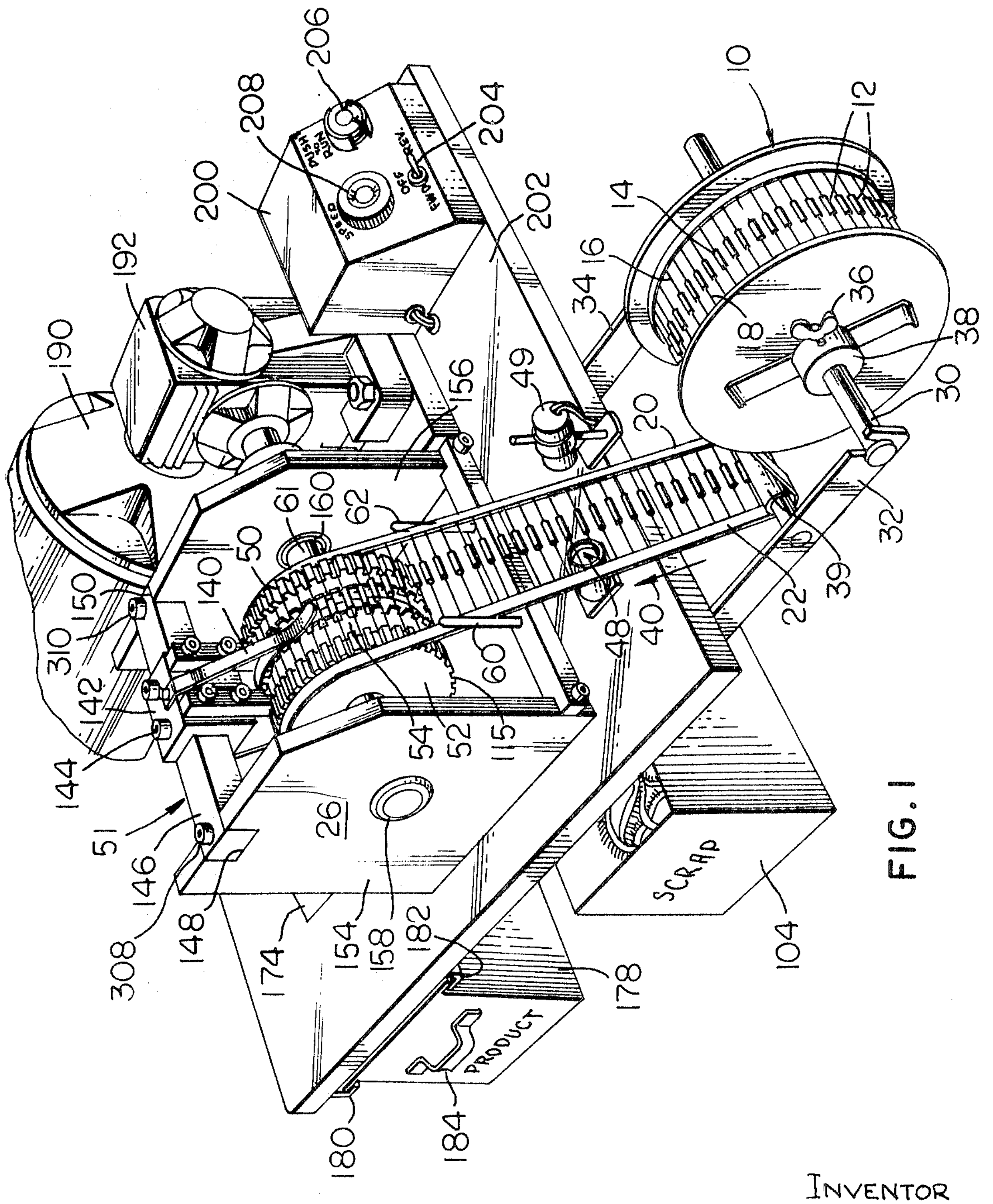
FIG. 1 is a perspective view of the apparatus showing the feed mechanism and forming elements.

Referring to FIG. 1, a supply reel 10 has rotatably mounted thereon a number of the electrical components which are designated by reference numeral 12 and are packaged spaced apart on the continuous length of tape. The components have bodies 14 with conductor leads 16 and 18 projecting from opposite ends of the body 14. The ends of the wire leads are held by tapes 20 and 22 which positively retain the components as they are transported to apparatus 26 for cutting and forming operations. The rate of movement of the components is not limited by any gravity feed principle; instead, these tapes are used as the transporting medium, carrying the conductor between opposed layers of the tapes which grip the opposite lead ends. The supply reel 10 is mounted for rotation on an axle 30 which in turn is journaled at the opposite ends thereof on two projecting arms 32 and 34. The reels can be exchanged for new supply reels, having a fresh supply of components by means of loosening a wingbolt 36 received through a threaded opening in boss 38 to lock the supply reel 10 rotatively with the shaft 30. A guide bar 39 is used to direct tension and direct the upward movement of the elements which are held by the tapes as indicated by the arrow 40, and in so doing moves past a light source 48 and a photosensitive cell 49 which can detect the point when there are no longer any components and thereby shut off the machine. Prior to introducing the continuously travelling strip of tape and spaced components to the apparatus designated generally by reference numeral 51 they are caused to move past two guide bars 60, 62 which center the inflow of forming material with respect to forming wheels 50, 52, and 54. The wheels 50, 52, and 54 consist of a plurality of crest grooves 115 at their outer periphery and they are keyed to shaft 61 by key 63 for continuous rotation therewith. As the components move into tangential engagement with wheels 50, 52 the ends of the leads drop into the grooves 55 and a driving connection is formed therewith, thereby pulling additional components and tape from the supply reel 10. The power shaft 61 rotates wheels 50, 52, and 54 to effect a continuous feed from supply reel 10 into the apparatus or machine 51.

As the wheels 50, 52 rotate they carry the ends of the leads adjacent the inner surfaces 66, 68 of the wheels 50, 52 (FIG. 5) past two cutting edges 80, 82 respectively of the stationary cutting fingers 84 and 86 and the cut ends of the leads which are held by the tapes are separated from the trimmed components (FIG. 5) and the now separated tapes with their respectively attached severed lead ends are caused to pass over shields 98, 100 moving the the direction of the arrow 102 (FIG. 2 and 3) and into a scrapbox 104 (FIG. 1).

The cutting wheels 50, 52 are locked on shaft 61 in accordance with the line of inflowing components by means of setscrews 105, 106 (FIG. 3) which can be loosened to provide for movement of the wheels 50, 52 and 54 back and forth into alignment with the incoming flow of components.

The incoming flow of components is such that the body portions 14 (FIG. 5) are received between the spaced-apart sides 112 and 114 of the inner wheel 54. The peripheries of the wheel sides 112 and 114 have a series of circumferentially spaced lands 113 and grooves 115 wherein are received the uncut terminals of the components so that after the cutting is performed of the outer ends, the components continue to move by virtue of the driving connection of the lands 113 with the portion of the conductor adjacent to the body 14 (see FIG. 5). Immediately after the cutting, the uncut portions of the wire leads are brought into engagement with the curved forming surfaces 117 of the respective fingers 84 and 86, (FIG. 5) causing them to bend backwardly, and as they move past the inner surfaces 119 (FIG. 7) the progressively bent conductor ends are drawn back into an approximate U-shaped condition which will proportion them for insertion into the openings of a printed circuit board.

In order to maintain the components in their proper positions relatively to the rotating wheels 50, 52, 54 they are biased radially inwardly by a resilient finger 140 (FIGS. 1 and 2) which is mounted on an adjustable slide 142 held by bolts 144 which can be loosened to locate the carriage relatively to a cross bar support 146 held at its opposite ends within slots 148 and 150 of the two upright sides 154 and 156. The sides 154 and 156 also provide spaced bearing supports 158, 160 for the drive shaft 61. The finger engages the bodies 14 so that they will not be forced out of the grooves 115 as they move past the cutting surfaces 80 and 82 and forming sides 117 of the fingers 84 and 86, (FIG. 5).

Figures 2, 3:
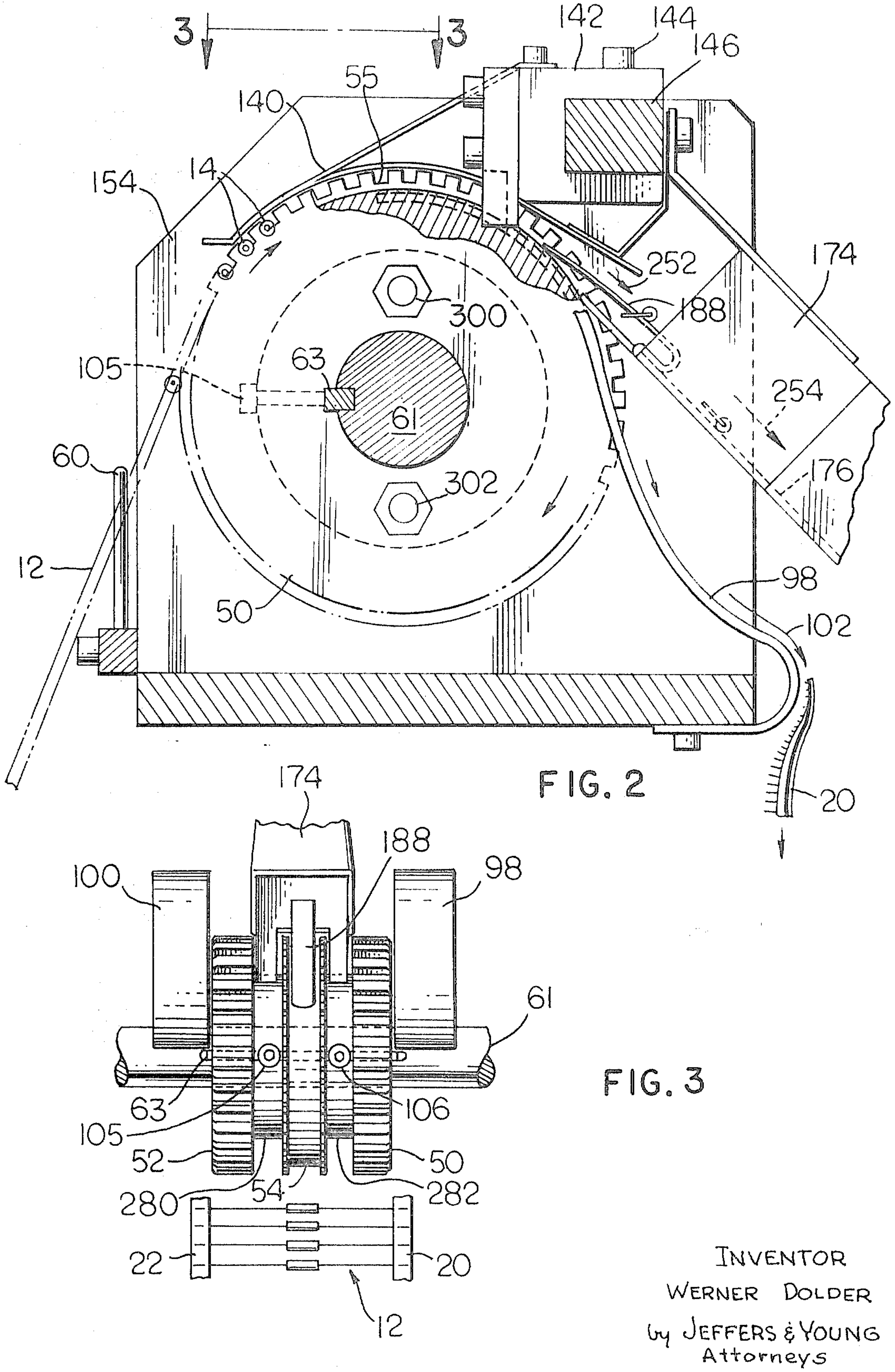
FIG. 2 is an enlarged sectional view taken transversely to the axis of rotation of the forming members which both carry and cut and form the electrical components and effect the sizing of the components.
FIG. 3 is an upper view of the apparatus shown in FIG. 2 looking in the direction of the arrows 3–3 in FIG. 2.
Figure 5:
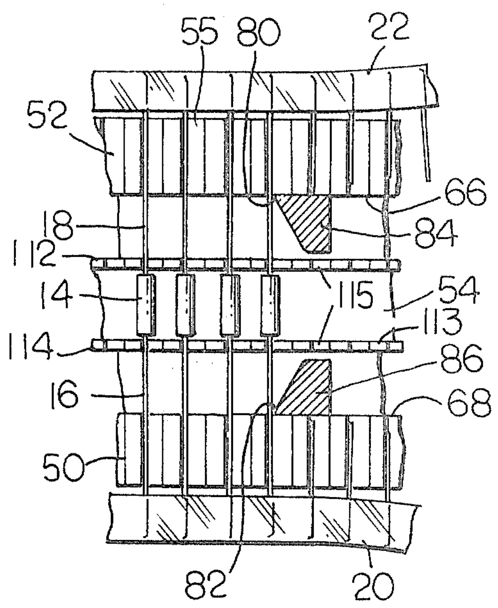
FIGS. 5, 6, and 7 illustrate in progressive views the cutting, initial shaping and final shaping of the components as they are carried through the apparatus, first past the cutting edge, (FIG. 5) then into contact with the shaping or forming surface (FIG. 6), then finally past the cut and forming fingers (FIG. 7); and, FIG. 8 is a sectional view of the ejecting finger illustrated in FIG. 2, showing how the finished components are raised from driving relation with the rotatable wheels and are allowed to drop into a storage for the finished product.
Figure 6:
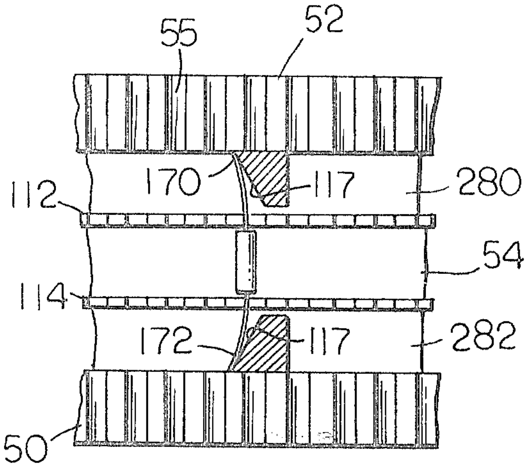
Figures 7, 8:
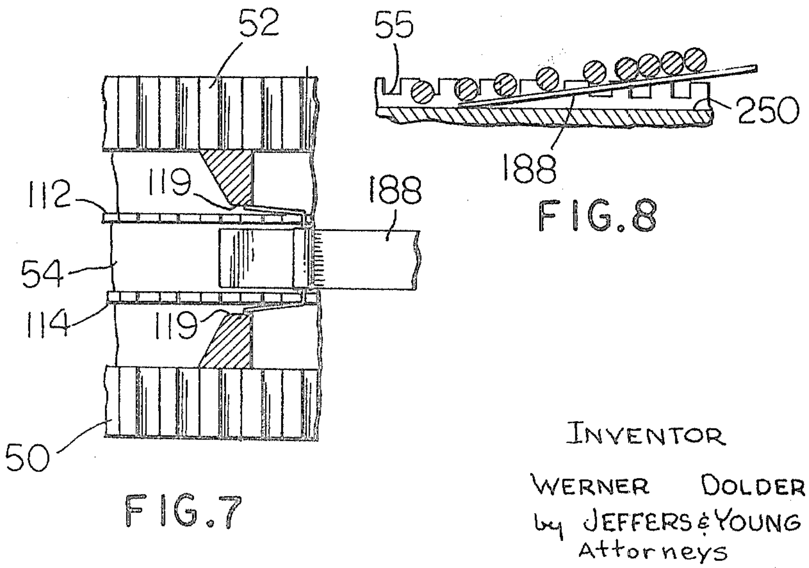

After the severed leads 170, 172 (FIGS. 5 and 6) have been formed by the sides 117 from a straight condition to a bent condition, this occurring in a gradual bending operation as indicated in the successive positions of FIGS. 5, 6, and 7, the bodies then come into engagement with an ejecting guide finger 188, (FIG. 8) which projects into the space between the spaced sides 112 and 114 of forming wheel 54 and thereby disengages them from the notches 115 which occur at regular spaced intervals in the sides 112 and 114 and are lifted out in the manner indicated in FIGS. 2 and 8. The momentum of the formed component received from the forming wheel 54 carries them forwardly on the finger 188 and they then fall under gravity into chute 174. The guide finger 188 guides the oncoming components into the chute as indicated by the dotted line arrow and component (FIG. 2) and once in the chute the components fall in a stream downwardly along the inclined base 176 terminating in an opening, where the finished product drops into a receiving container 188 (FIG. 1). The receptacle 188 is supported on rails 180, 182 and can be pulled transversely by handle 184 to empty the container of the finished product.

The apparatus described is powered by means of a motor 190 (FIG. 1) acting through a speed control and gear arrangement 192 which powers the shaft 61. In front of the motor and accessible to the operator is a control box 200 mounted on panel 202 and including a switch 204 which can turn the apparatus off and on and determine the direction of the run. In addition to the on-off switch is a contact switch 206 which, when depressed will cause the apparatus to run continuously and a speed control 208. The operator can thus manually control the direction, speed and time of run of the apparatus.

Figure 4:
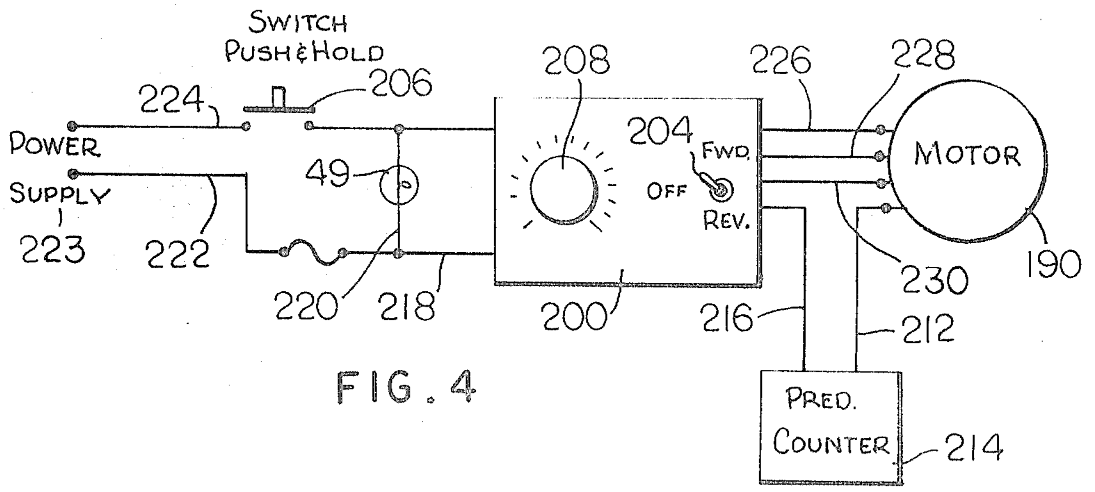
FIG. 4 is a schematic of the control circuit for the apparatus of the present invention.

Referring next to FIG. 4, there is shown a control circuit including a motor 190, which is connected through conductor 212 with a counter 214 which can be set in order to produce the desired number of components and is then, connected through conductor 216 to the control 200 for manual operation. The control 200 also connected through a conductor 218 to light-sensitive element 49 through conductor 220 which can also shut the machine off if there is not a supply of electrical components to the machine. The motor is actuated through the control 200 from a line supply 223 which is connected through conductors 222 and 224 through the manual switch 206 thereby energizing the motor from the control 200 through conductors 226, 228, and 230.

OPERATION OF THE DEVICE

In operation, a reel 10 (FIG. 1) is supplied having a plurality of components supported on continuous length tape sections 20, 22 which hold and grip the ends of the leads, thereby causing them to travel with the length of tapes 20, 22. The operator, at the start of operations usually starts at slow speed in order to prevent undue strain on the tapes and leads until the inertia of the reel 10 is overcome. Speed can be controlled from speed regulator 208 and in preparation for use, the switch 204 is moved to a forward position and switch 206 is depressed manually.

Assuming that there is a continuous inflow of components the light source 48 in conjunction with the light-sensitive element 49 will sense this fact and permit the apparatus to function. As the tapes 20, 22 and the accompanying components move upwardly in the direction of the arrow 40 and past guide 60, 62 they are centered relatively to the wheels 50, 52, 54 and the leads of the components being received in the notches of wheels 50, 52 cause them to move with the wheels and thus pull on the length of tape producing an unwinding and inflow of the tapes and attached components as an inflow to the apparatus 51. As the leads are moved into engagement with the cutting edges 80, 82 of the fingers 84, 86 the ends are cut and the severed portions of the ends are retained with the tape lengths as indicated in FIG. 5 and the tape lengths together with the severed portions of the leads are passed over the shields 98 and 100 and into the receptacle 104.

After being severed, the cut ends of the leads move into engagement with surfaces 117 of fingers 84, 86 and are progressively bent back as indicated in FIG. 6 until reaching the configuration indicated in FIG. 7. During cutting and forming the components are held against the peripheries of the wheels 50, 52, 54 within the toothed peripheries thereof by resilient finger 140 which leans against the bodies of the components moving therepast. After forming of the components, the driving force provided imparts momentum to the components so that when the bodies of the components come into contact with the ejecting finger 188 (FIGS. 2 and 8), they will be lifted out of the recess 250 and their momentum is sufficient so that they are propelled forwardly in the direction of the arrow 252 (FIG. 2) and follow the direction of the dotted line arrow 254, entering chute 174 where they drop onto the inclined base 176 and are discharged into receptacle 178.

The spacing between the ends of the fingers 84, 86 as indicated by projected ends 119 (FIG. 7) is sufficient to allow the bent backwardly ends of the leads to pass between ends 119 and the sides of wheels 112, 114.

The operation proceeds continuously and at a controlled speed and is capable of processing components at a considerable rate, which is substantially unlimited, being determined only by the rate of speed or rotation of the shaft 61. I have successfully processed diodes with glass bodies at the rate of 105,000 per hour and have detected no damage to the finished components in the process of so producing them at this accelerated rate.

After the reel 10 is emptied the wingnut 36 is loosened thereby permitting the reel to be slid off of the axle 30 and a new reel put in its place. Other feeding mechanisms are within the purview of the present invention as for example additional axles spaced vertically so that as one reel is exhausted it then can be connected with the incoming end of the fresh reel.

The apparatus is prepared for operation by suitably adjusting and locating the cutting and forming wheels 50, 52, 54 on the shaft 61 by loosening the setscrews 104, 106, it being noted that these wheels move closely past the cut and forming fingers 84, 86. The wheels 50, 52 being in slidable engagement and the sides of the wheel 54 being spaced by approximately the diameter of the lead wires (FIG. 5). Spacer sections 280 and 282 determine the location of the inner wheels 112, 114 in relation to the ends 119 of the fingers thereby to form the uncut sections of the leads after they are severed.

The operation of progressively cutting and forming components was previously limited by the rate at which the relatively light components could drop into the apparatus during feeding, but in the present invention there is no such limitation imposed by gravity feed and therefore the elements can be brought at a rapid pace into forming relation with the cutting and forming wheels and the output of the apparatus is for that reason much improved over preexisting machines for performing the same functions in fabricating similarly constructed elements.

If preferred, I can bend only one of the lead ends by omitting the forming surface 117 on one of the cut-and-forming fingers. Also, I can determine the degree of bend by suitable configuration of the surfaces 117 and these obvious changes are within the spirit and scope of the present invention and are intended to be included within the scope of the following claims.

I can also form other size components by substituting additional pairs of forming wheels, the pairs of wheels being held together by means of bolts 300 and 302 (FIG. 2) and simply slipping such wheels off of the axle 61 (not that the side 154 is detachable by means of the bolt 308 and 310) and putting in a new set of wheels. These adjustments and setups for the apparatus can be performed quickly and conveniently.

The apparatus is inexpensive to produce and is reliable in operation.

Although the present invention has been illustrated and described in connection with a single-example embodiment, it will be understood that this is illustrative of the invention and is by no means restrictive thereof. It is reasonably to be expected that those skilled in this art can make numerous revisions and adaptations of the invention and it is intended that such revisions and adaptations will be included within the scope of the following claims as equivalents of the invention.

What I claim is:

1. Apparatus for shaping axial leads in electrical components comprising:

means for positively carrying and directing the movement of said components into said apparatus, a pair of continuously moveable driving members having spaced driving elements which receive the leads and effect a driving connection therewith propelling said components through said apparatus whereby said components are substantially continuously under positive propelling force, a pair of stationary combination cutting and forming members disposed one adjacent each of said driving members to cut the ends of said leads, and additional driving means adopted to drivably engage uncut portions of said components and effect forcible movement thereof past the forming portions of the cutting and forming members to effect a preferred forming of said leads.

2. The apparatus of claim 1, including means disposed in the path of movement of said components to effect their withdrawal from said additional driving member subsequent to forming of said components.

3. The apparatus of claim 1 including means for biasing said components into driving engagement with said driving elements.

4. The apparatus of claim 1, including means for receiving and collecting the cut section of leads which are severed from said components and receiving same in a continuous flow from said apparatus.

5. The apparatus in accordance with claim 1, including means for continuously collecting the finished components as they are ejected from said apparatus.

6. The apparatus in accordance with claim 5, wherein said additional driving means is rotatable for feeding a continuous flow of components past said forming elements further comprising means for ejecting the completely formed components.

7. A process for forming electrical components comprising the steps of:

securing the ends of electrical components in spaced relation on a pair of continuously travelling flexible means which maintain the relative spacing of such components, forcibly feeding the components onto a continuously moving carrier member having positive drive connections with the leads of such components, continuously trimming the ends of said components to effect a separation of the components, and thereafter forming the uncut portions of said separated components to a U-shape configuration, ejecting the finished components from the continuously travelling carrier member and thereafter collecting the completely formed electrical components.

8. The process in accordance with claim 7 including the step of separating the flexible means holding the severed portions of said components and separately collecting such severed portions.

9. The process in accordance with claim 7 including the step of transferring the drive connection from the severed portion of the component to an unsevered portion of the component to effect complete forming thereof.

10. The process in accordance with claim 7 including the step of positioning the body of the connector component within a recess of said carrier between two drive means hereon which constitute the drive connection impelling the electrical component past forming members after severing the outer portions of the leads of said components.

11. The process in accordance with claim 7 including the step of continuously supplying a quantity of said electrical components to said carrier whereby the process for forming electrical components is substantially continuous.

12. The process in accordance with claim 7 including the step of biasing the electrical components into driving engagement with said carrier for effecting movement of the components past the forming members, whereby the continuously driven electrical components are disposed at the proper operative position at all times as they move through the forming apparatus.